(12) United States Patent
Kim et al.

(10) Patent No.: US 7,078,350 B2
(45) Date of Patent: Jul. 18, 2006

(54) METHODS FOR THE OPTIMIZATION OF SUBSTRATE ETCHING IN A PLASMA PROCESSING SYSTEM

(75) Inventors: Jisoo Kim, Pleasanton, CA (US); Binet Worsham, Mountain View, CA (US); Bi-Ming Yen, Fremont, CA (US); Peter K. Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 176 days.

(21) Appl. No.: 10/804,430

(22) Filed: Mar. 19, 2004

(65) Prior Publication Data

US 2005/0205519 A1 Sep. 22, 2005

(51) Int. Cl.
*H01L 21/302* (2006.01)

(52) U.S. Cl. .................. 438/717; 438/623; 438/706; 438/710

(58) Field of Classification Search ................ 438/706, 438/710, 712, 720, 623, 624, 643, 671, 717
See application file for complete search history.

(56) References Cited

U.S. PATENT DOCUMENTS

| | | | |
|---|---|---|---|
| 6,518,174 B1 | 2/2003 | Annapragada et al. | |
| 6,583,047 B1 * | 6/2003 | Daniels et al. | 438/623 |
| 6,716,742 B1 * | 4/2004 | Gates et al. | 438/623 |
| 2001/0000246 A1 * | 4/2001 | Tang et al. | 438/689 |
| 2003/0190807 A1 * | 10/2003 | Soda et al. | 438/689 |

OTHER PUBLICATIONS

Yeoh et al., "Photoresist Strip on Orion2.2™ in Via First Dual Damascene Cu Structures", Trikon Technologies, Ringland Way, Newport, South Wales, http://www.trikon.com/lowk/avs_2002_yeoh_abstract.pdf.

Hu et al., "Resist Stripping for Multilevel Interconnect Integrating Low-k Dielectric Material", Feb. 2000, AVS First International Conference on Microelectornics and Interfaces.

(Continued)

*Primary Examiner*—Lan Vinh
(74) *Attorney, Agent, or Firm*—IP Strategy Group, P.C.

(57) ABSTRACT

A method of etching a substrate in a plasma processing system is disclosed. The substrate has a semi-conductor layer, a first barrier layer disposed above the semi-conductor layer, a low-k layer disposed above the first barrier layer, a third hard mask layer disposed above the low-k layer; a second hard mask layer disposed above the third hard mask layer, and a first hard mask layer disposed above the second hard mask layer. The method includes alternatively etching the substrate with a first etchant and a second etchant, wherein the first etchant has a low selectivity to a first hard mask material of the first hard mask layer, a third hard mask material of the a third hard mask layer, and a first barrier layer material of the first barrier layer, but a high selectivity to a second hard mask material of the second hard mask layer; and wherein the second etchant has a high selectivity to the first hard mask material of the first hard mask layer, the third hard mask material of the third hard mask layer, and the first barrier layer material of the first barrier layer, and the second etchant has a low selectivity to the second hard mask material of the second hard mask layer.

35 Claims, 13 Drawing Sheets

OTHER PUBLICATIONS

Chhambra et al., "Interconnect Challenges and Strategic Solutions", Feb. 2, 2002, Future Fab Intl. vol. 12, Issue 17, http://www.future-fab.com/documents.asp?d ID=912.

Singer, Peter, "Dual-Damascene Challenges Dielectric Etch", Aug. 1999, Semiconductor International, http://www.semipark.co.kr/upload1/Dual-Damascene%20Challenges%20Dielectric%20Etch.pdf.

Schmid et al., "A Novel Oxazole Based Low k Dielectric Addresses Copper Damascene Needs", Semiconductor Fabtech 12$^{th}$ edition, pp. 231-235, http://www.semiconductorfabtech.com/journals/edition.12/fabtech12.pdfs/ft12_pg231.pdf.

Peters, Laura, "Solving the Integration Challenges of Low-k Dielectrics", Nov. 1999, Semiconductor International 22, No. 13, pp. 56-64.

Lassig et al., "Selective Removal Strategies for Low k Dual Damascene", Dec. 2001, Semiconductor Fabtech Edition 15, pp. 185-190.

Ramalingam et al., "Photoresist Trimming: Etch Solutions to CD Uniformity and Tuning", Sep. 2002, Semiconductor International vol. 20, Issue 5.

Wolf, "Overview of Dual Damascene Cu/Low-k Interconnect", Aug. 2003, International SeMaTech.

Mo Koo, "Design and Process Issues of Junction- and Ferroelectric- Field Effect Transistors in Silicon Carbide", 2003, KTH, Royal Institute of Technology Department of Microelectronics and Information Technology Device Technology Laboratory, ISRN KTH/EKT/FR-2003/1-SE.

Lei et al., "The Effect of Ash Processes on Inorganic Porous Low-k Materials," Honeywell Electronic Materials, 4 pp.

Collins et al., "Chapter 1: Plasmas for Fun and Profit: A Survey of an Enabling Technology," 1999, pp. 1-24.

Collins et al., "Chapter 3: The Wax and Wane of Plasma Technology in IC Manufacturing," 1999, pp. 1-30.

Guerra et al., "Implementation of Plasma Processing into BEOL with Organic Low-k Dielectrics," 2002 Semiconductor Equipment and Materials International, 5 pp.

* cited by examiner

502 — INTRODUCING IN A PLASMA PROCESSING SYSTEM, A SUBSTRATE HAVING A SEMI-CONDUCTOR LAYER, A FIRST BARRIER LAYER DISPOSED ABOVE THE SEMI-CONDUCTOR LAYER, A LOW-K LAYER DISPOSED ABOVE THE FIRST BARRIER LAYER, A THIRD HARD MASK LAYER DISPOSED ABOVE THE LOW-K LAYER; A SECOND HARD MASK LAYER DISPOSED ABOVE THE THIRD HARD MASK LAYER, AND A FIRST HARD MASK LAYER DISPOSED ABOVE THE SECOND HARD MASK LAYER.

504 — ALTERNATIVELY ETCHING THE SUBSTRATE WITH A FIRST ETCHANT AND A SECOND ETCHANT, WHEREIN THE FIRST ETCHANT HAS A LOW SELECTIVITY TO A FIRST HARD MASK MATERIAL OF THE FIRST HARD MASK LAYER, A THIRD HARD MASK MATERIAL OF THE A THIRD HARD MASK LAYER, AND A FIRST BARRIER LAYER MATERIAL OF THE FIRST BARRIER LAYER, BUT A HIGH SELECTIVITY TO A SECOND HARD MASK MATERIAL OF THE SECOND HARD MASK LAYER, AND WHEREIN THE SECOND ETCHANT HAS A HIGH SELECTIVITY TO THE FIRST HARD MASK MATERIAL OF THE FIRST HARD MASK LAYER, THE THIRD HARD MASK MATERIAL OF THE THIRD HARD MASK LAYER, AND THE FIRST BARRIER LAYER MATERIAL OF THE FIRST BARRIER LAYER, AND THE SECOND ETCHANT HAS A LOW SELECTIVITY TO THE SECOND HARD MASK MATERIAL OF THE SECOND HARD MASK LAYER.

FIG. 5A

506 — INTRODUCING IN A PLASMA PROCESSING SYSTEM, A SUBSTRATE HAVING A SEMI-CONDUCTOR LAYER, A FIRST BARRIER LAYER DISPOSED ABOVE THE SEMI-CONDUCTOR LAYER, A LOW-K LAYER DISPOSED ABOVE THE FIRST BARRIER LAYER, A SECOND BARRIER LAYER DISPOSED ABOVE THE LOW–K LAYER, A THIRD HARD MASK LAYER DISPOSED ABOVE THE SECOND BARRIER LAYER, A SECOND HARD MASK LAYER DISPOSED ABOVE THE THIRD HARD MASK LAYER, AND A FIRST HARD MASK LAYER DISPOSED ABOVE THE SECOND HARD MASK LAYER.

508 — ALTERNATIVELY ETCHING THE SUBSTRATE WITH A FIRST ETCHANT AND A SECOND ETCHANT, WHEREIN THE FIRST ETCHANT HAS A LOW SELECTIVITY TO A FIRST HARD MASK MATERIAL OF THE FIRST HARD MASK LAYER, A THIRD HARD MASK MATERIAL OF THE A THIRD HARD MASK LAYER, AND A FIRST BARRIER LAYER MATERIAL OF THE FIRST BARRIER LAYER, BUT A HIGH SELECTIVITY TO A SECOND HARD MASK MATERIAL OF THE SECOND HARD MASK LAYER, AND WHEREIN THE SECOND ETCHANT HAS A HIGH SELECTIVITY TO THE FIRST HARD MASK MATERIAL OF THE FIRST HARD MASK LAYER, THE THIRD HARD MASK MATERIAL OF THE THIRD HARD MASK LAYER, AND THE FIRST BARRIER LAYER MATERIAL OF THE FIRST BARRIER LAYER, AND THE SECOND ETCHANT HAS A LOW SELECTIVITY TO THE SECOND HARD MASK MATERIAL OF THE SECOND HARD MASK LAYER AND THE SECOND BARRIER LAYER.

FIG. 5B

METHODS FOR THE OPTIMIZATION OF SUBSTRATE ETCHING IN A PLASMA PROCESSING SYSTEM

BACKGROUND OF THE INVENTION

The present invention relates in general to substrate manufacturing technologies and in particular to methods for the optimization of substrate etching in a plasma processing system.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant source are then flowed into the chamber and struck to form a plasma to etch exposed areas of the substrate.

Referring now to FIG. 1, a simplified diagram of plasma processing system components is shown. Generally, an appropriate set of gases is flowed into chamber 102 through an inlet 108 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck 116. In addition, liner 117 provides a thermal barrier between the plasma and the plasma processing chamber, as well as helping to optimize plasma 110 on substrate 114.

Gas distribution system 122 is commonly comprised of compressed gas cylinders 124a–f containing plasma processing gases (e.g., $C_4F_8$, $C_4F_6$, $CHF_3$, $CH_2F_3$, $CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a–f may be further protected by an enclosure 128 that provides local exhaust ventilation. Mass flow controllers 126a–f are commonly a self-contained devices (consisting of a transducer, control valve, and control and signal-processing electronics) commonly used in the semiconductor industry to measure and regulate the mass flow of gas to the plasma processing system. Injector 109 introduces plasma processing gases 124 as an aerosol into chamber 102.

Induction coil 131 is separated from the plasma by a dielectric window 104, and generally induces a time-varying electric current in the plasma processing gases to create plasma 110. The window both protects induction coil from plasma 110, and allows the generated RF field to penetrate into the plasma processing chamber. Further coupled to induction coil 131 at leads 130a–b is matching network 132 that may be further coupled to RF generator 138. Matching network 132 attempts to match the impedance of RF generator 138, which typically operates at 13.56 MHz and 50 ohms, to that of the plasma 110.

Generally, some type of cooling system is coupled to the chuck in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In a common substrate manufacturing method, known as dual damascene, dielectric layers are electrically connected by a conductive plug filling a via hole. Generally, an opening is formed in a dielectric layer, usually lined with a TaN or TiN barrier, and then subsequently filled with a conductive material (e.g., aluminum (Al), copper (Cu), etc.) that allows electrical contact between two sets of conductive patterns. This establishes electrical contact between two active regions on the substrate, such as a source/drain region. Excess conductive material on the surface of the dielectric layer is typically removed by chemical mechanical polishing (CMP). A blanket layer of silicon nitride is then deposited to cap the copper.

There are generally three commonly used approaches for manufacturing dual damascene substrates: via-first, trench-first, and self-align. In one example of the via-first methodology, the substrate is first coated with photoresist and then the vias are lithographically patterned. Next, an anisotropic etch cuts through the surface cap material and etches down through the low-k layer of the substrate, and stops on a silicon nitride barrier, just above the underlying metal layer. Next, the via photoresist layer is stripped, and the trench photoresist is applied and lithographically patterned. Typically, some of the photoresist will remain in the bottom of the via, or the via may be covered by an organic ARC plug, in order to prevent the lower portion via from being over-etched during the trench etch process. A second anisotropic etch then cuts through the surface cap material and etches the low-k material down to a desired depth. This etch forms the trench. The photoresist is then stripped and the Silicon Nitride barrier at the bottom of the via is opened with a very soft, low-energy etch that will not cause the underlying copper to sputter into the via. As described above, the trench and via are filled with a conductive material (e.g., aluminum (Al), Copper (Cu), etc.) and polished by chemical mechanical polishing (CMP). And although the via-first approach has been widely adopted for small geometry devices because of a large window for misalignment, it is also prone to photoresist poisoning and a crown like fence over the via.

An alternate methodology is trench-first. In one example of a dual hard mask approach, the substrate is coated with photoresist and a trench lithographic pattern is applied. An anisotropic dry etch then cuts through the surface hard mask (again typically SiN, TiN or TaN) followed by stripping the photoresist. Another photoresist is applied over the trench hard mask and then the vias are lithographically patterned. A second anisotropic etch then cuts through cap layer and partially etches down into the low-k material. This etch forms the partial vias. The photoresist is then stripped for trench etch over the vias with the hard mask. The trench etch then cuts through the cap layer and partially etches the low-k material down to desired depth. This etch also clears via holes at the same time stopping on the final barrier located at the bottom of the via. The bottom barrier is then opened with a special etch. However, trench-first methodology also requires near-perfect trench-to-via alignment in order to properly etch the via.

Yet another methodology is called self-align. This method combines the oxide etch steps but requires two separate ILD (interlevel dielectric) depositions with an intervening nitride mask and etch step. The lower (via) dielectric is deposited with a nitride etch stop on both top and bottom. The top nitride is masked and etched to form a via hard mask. This requires a special nitride etch process. Then the top (line) dielectric is deposited. Finally, the trench mask is aligned with the via openings that have been etched in the nitride, and both the trench and vias are etched in both layers of oxide with one etch step. However, the self-align methodology often requires high nitride-to-oxide etch selectivity and, like the trench-first methodology, requires near-perfect trench-to-via alignment in order to properly etch the via.

To facilitate discussion, FIG. 2A illustrates an idealized cross-sectional view of the layer stack, representing the layers of an exemplar semiconductor IC, prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of the layer stack, there is shown a layer 208, comprising a semi-conductor, such as $SiO_2$. Above layer 208 is disposed a barrier layer 204, typically comprising nitride or carbide (e.g., SiN, SiC, etc.). Dual damascene substrates further comprise a set of metal layers including M1 209a–b, typically comprising aluminum or copper. Above the barrier layer 204, is disposed a intermediate dielectric (IMD) layer 206, comprising a low-k material (e.g., SiOC, etc.). Above the IMD layer 206, there may be placed a cap layer 203, typically comprising $SiO_2$. Above cap layer 203, there may be disposed a trench mask layer 202, typically comprising TiN, SiN, or TaN.

FIG. 2B shows a somewhat idealized cross-sectional view of the layer stack of FIG. 2A, after photoresist layer 220 and a BARC layer 222 is further added.

FIG. 2C shows a somewhat idealized cross-sectional view of the layer stack of FIG. 2B after photoresist layer 220 and BARC layer 222 have been processed through lithography. In this example, a photoresist mask pattern is created with a set of trenches 214a–b.

FIG. 2D shows the cross-sectional view of the layer stack of FIG. 2C after trench mask layer 202 has been processed in the plasma system, further extending trench 214a–b to cap layer 203.

FIG. 2E shows the cross-sectional view of the layer stack of FIG. 2D, after photoresist layer 220 and a BARC layer 222 are removed.

FIG. 2F shows the cross-sectional view of the layer stack of FIG. 2E after a second photoresist layer 216 and a BARC layer 218 are disposed, in order to create a second metal layer and a via connecting it to the first metal layer 209a–b.

FIG. 2G shows the cross-sectional view of the layer stack of FIG. 2F after the photoresist layer has been opened and an etch has been performed to partially etch into IMD layer 206 to create a via.

FIG. 2H shows the cross-sectional view of the layer stack of FIG. 2G after photoresist layer 216 and BARC layer 218 have been stripped, and an additional etch process has been performed to extend the trench to a desired depth and etch through a via stopping on barrier layer 204.

In FIG. 2I, the barrier layer 204 is etched through using, for example $CH_2F_2$, $CH_3F$, etc. In FIG. 2J, a chemical mechanical polish process has been performed to polish the layer stack down to cap layer 203, and a conductive material (e.g., aluminum (Al), Copper (Cu), etc.) has been deposited to contact the existing M1 metal material.

However, escalating requirements for high circuit density on substrates may be difficult to satisfy using current plasma processing technologies where sub-micron via contacts and trenches have high aspect ratios. The utilization of new low-k films and complex film stacks present a new set of challenges for dielectric etch processes and equipment.

For example, in these and other substrate manufacturing methods, the process of removing photoresist and BARC (bottom anti-reflective coating) can often damage low-k material in the substrate. Generally, low-k material consists of a large concentration of carbon and hydrogen, which helps to improve mechanical strength to current flow and minimizes cross talk between conductor lines. However, oxygen used in conventional photoresist stripping processes may react with the carbon in the photoresist to create volatile $CO_2$ gas and substantially reduces the carbon concentration in exposed areas. Since, lowering carbon content may also substantially increase the corresponding k value, photoresist removal may detrimentally increase the RC time delay.

In addition, exposure to oxygen may aggravate via corner erosion and fencing, as well as cause trench and via dimensional changes. This may become even more problematic as substrate manufactures pursue next generation dielectrics with extremely low-k values (<2) and thus very high carbon concentrations. These materials, aside from potentially presenting substantial mechanical adhesion problems during CMP (chemical-mechanical polishing) processes, may also be susceptible to pitting and severe dimensional changes during processes that contain substantial amounts of oxygen, such as photoresist stripping. Referring now to FIG. 3A, the a cross-sectional view of a layer stack, as shown in FIG. 2, in which fencing 302 has occurred. Referring now to FIG. 3B, the a cross-sectional view of a layer stack, as shown in FIG. 2, in which corner erosion 304 has occurred.

In view of the foregoing, there are desired improved methods for the optimization of substrate etching in a plasma processing system.

SUMMARY OF THE INVENTION

The invention relates, in one embodiment, to a method of etching a substrate in a plasma processing system. The substrate has a semi-conductor layer, a first barrier layer disposed above the semi-conductor layer, a low-k layer disposed above the first barrier layer, a third hard mask layer disposed above the low-k layer; a second hard mask layer disposed above the third hard mask layer, and a first hard mask layer disposed above the second hard mask layer. The method includes alternatively etching the substrate with a first etchant and a second etchant, wherein the first etchant has a low selectivity to a first hard mask material of the first hard mask layer, a third hard mask material of the a third hard mask layer, and a first barrier layer material of the first barrier layer, but a high selectivity to a second hard mask material of the second hard mask layer; and wherein the second etchant has a high selectivity to the first hard mask material of the first hard mask layer, the third hard mask material of the third hard mask layer, and the first barrier layer material of the first barrier layer, and the second etchant has a low selectivity to the second hard mask material of the second hard mask layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 5A shows a simplified process in which a substrate is etched with a set of hard masks, according to one embodiment of the invention; and FIG. 5B shows a simplified process in which a substrate with a second barrier layer is etched with a set of hard masks, according to one embodiment of the invention.

DETAILED DESCRIPTION OF THE PREFERRED EMBODIMENTS

Figure 1:
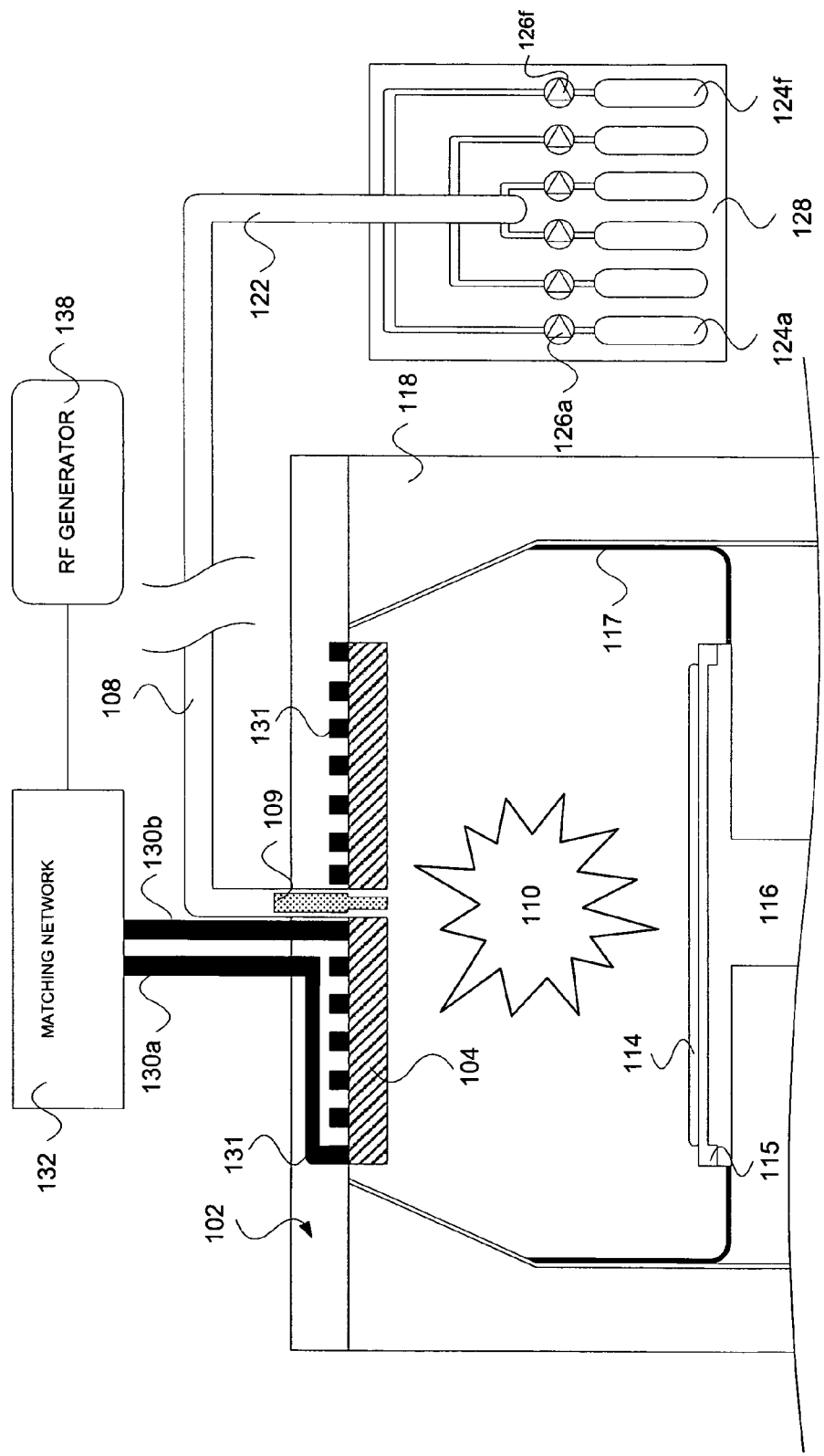
FIG. 1 illustrates a simplified diagram of plasma processing system components.
Figure 2A:
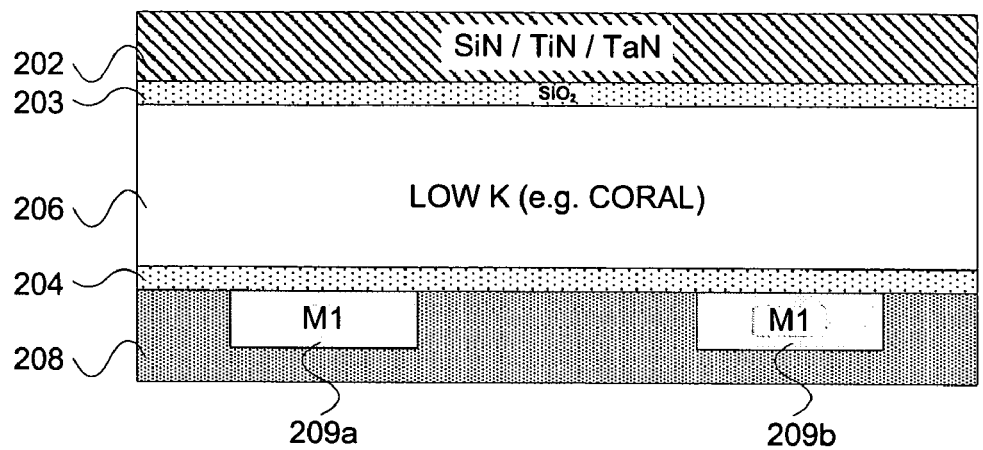
FIG. 2A illustrates an idealized cross-sectional view of a layer stack, representing the layers of an exemplar semiconductor IC, prior to a lithographic step.
Figure 2B:
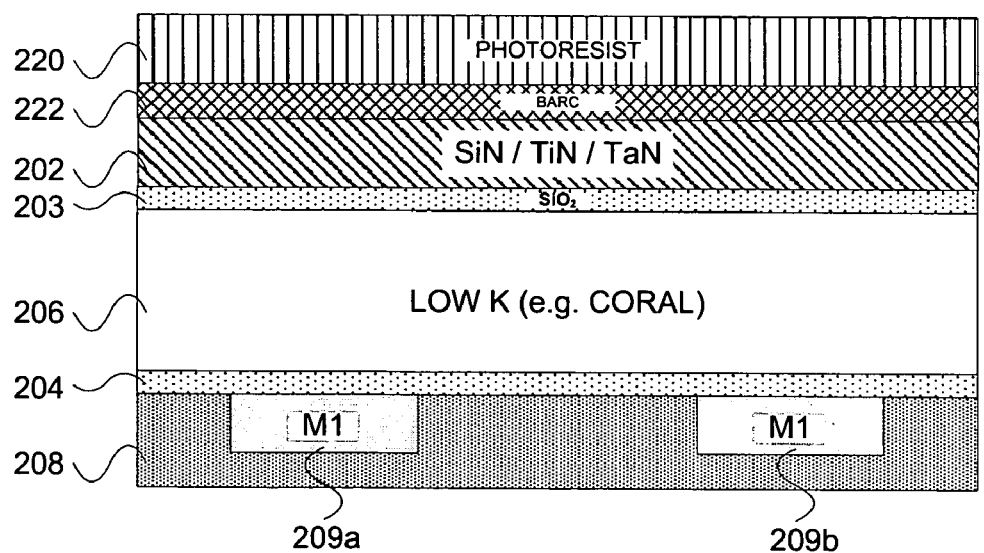
FIG. 2B shows a somewhat idealized cross-sectional view of the layer stack of FIG. 2A, after a first photoresist layer and a first BARC layer are added.
Figure 2C:
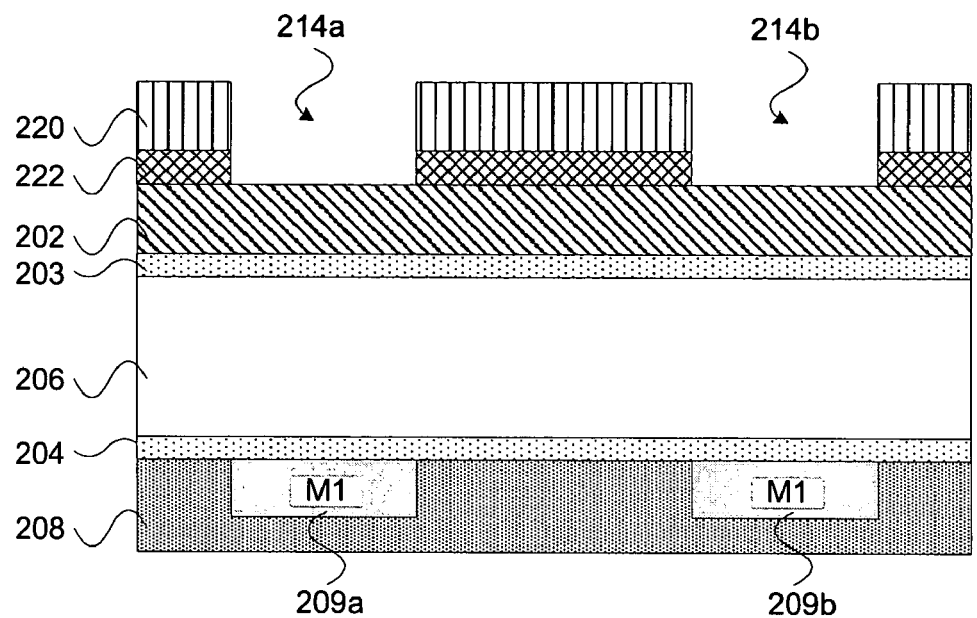
FIG. 2C shows a somewhat idealized cross-sectional view of the layer stack of FIG. 2B after the first photoresist layer and the first BARC layer have been processed through lithography.
Figure 2D:
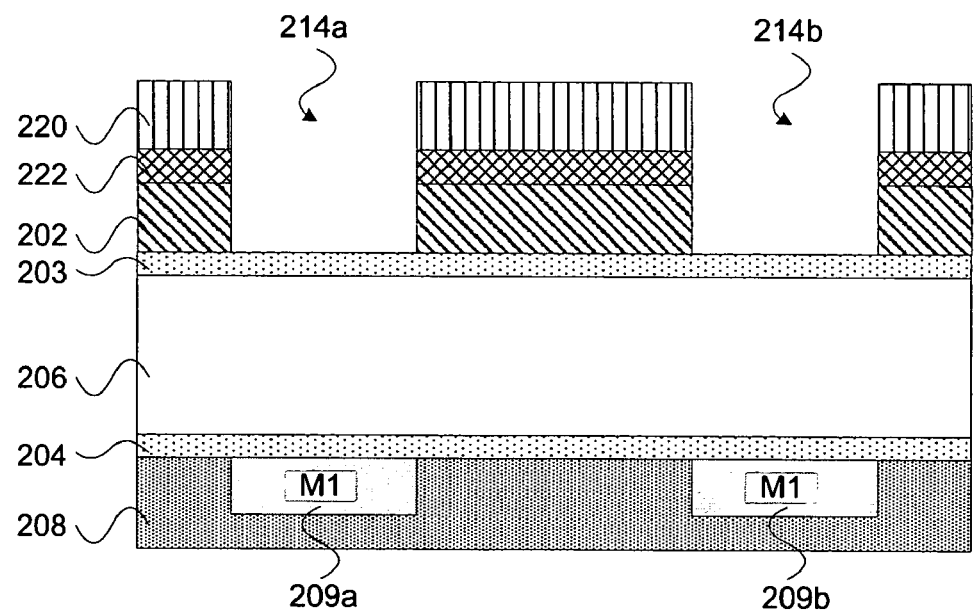
FIG. 2D shows the cross-sectional view of the layer stack of FIG. 2C after a trench mask layer has been processed.
Figure 2E:
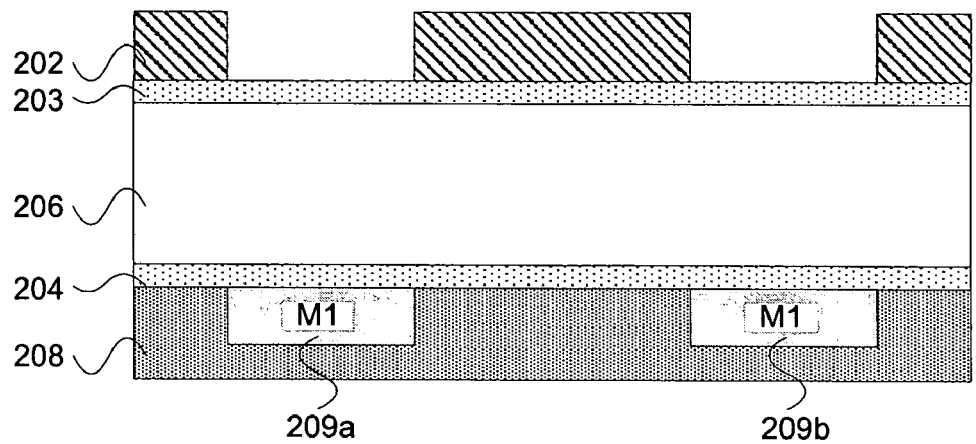
FIG. 2E shows the cross-sectional view of the layer stack of FIG. 2D, after the first photoresist layer and the first BARC layer are removed.
Figure 2F:
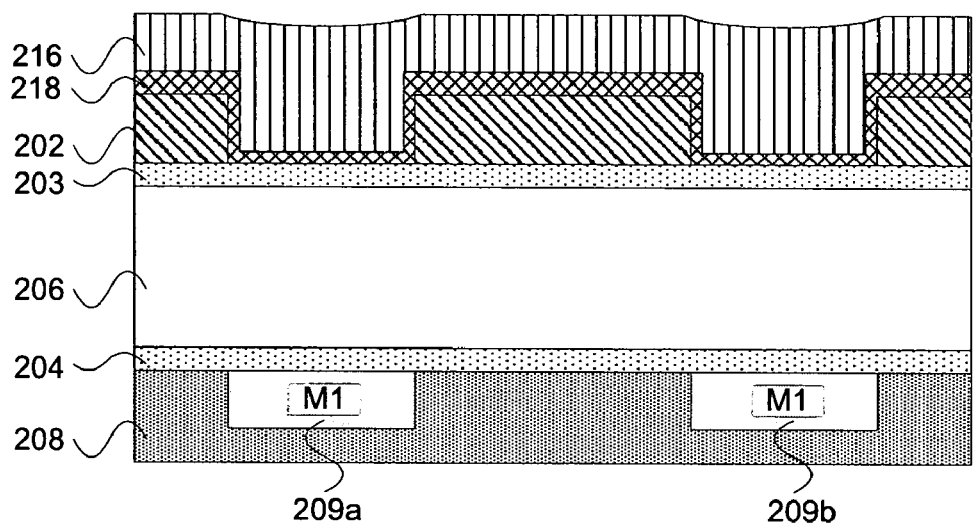
FIG. 2F shows the cross-sectional view of the layer stack of FIG. 2E after a second photoresist layer and a second BARC layer are disposed.
Figure 2G:
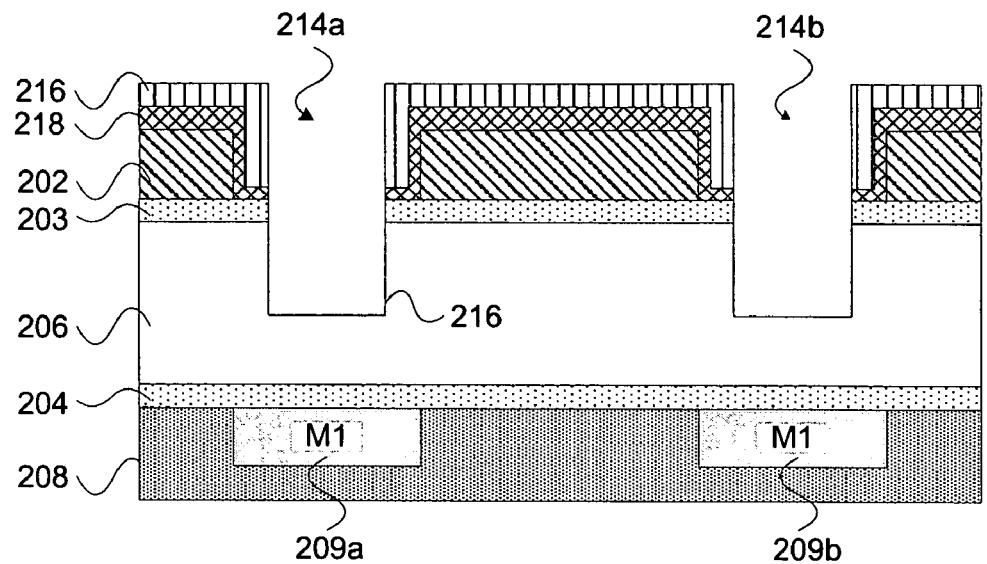
FIG. 2G shows the cross-sectional view of the layer stack of FIG. 2F after the second photoresist layer has been opened and an etch has been performed to partially etch into the IMD layer to create a via.
Figure 2H:
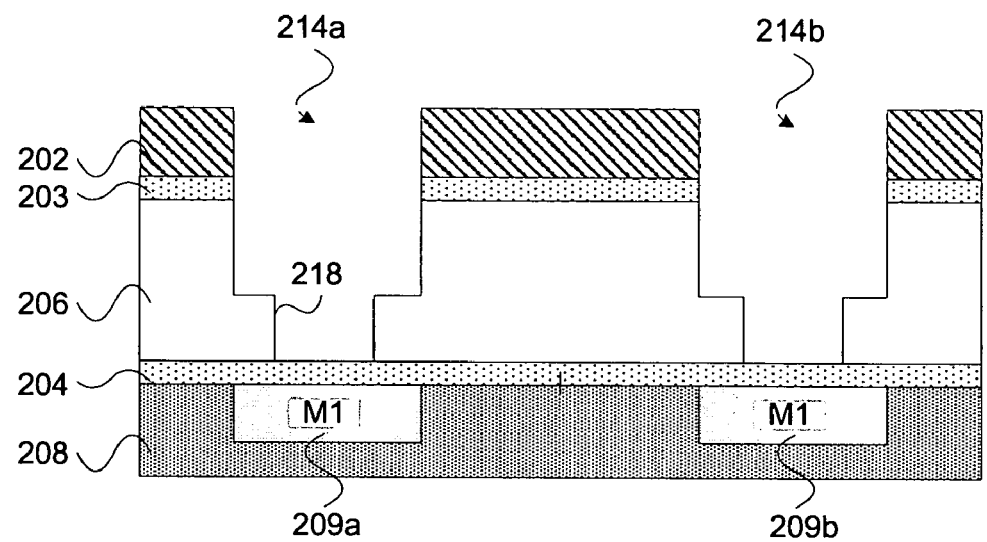
FIG. 2H shows the cross-sectional view of the layer stack of FIG. 2G after the second photoresist layer and second BARC layer have been stripped.
Figure 2I:
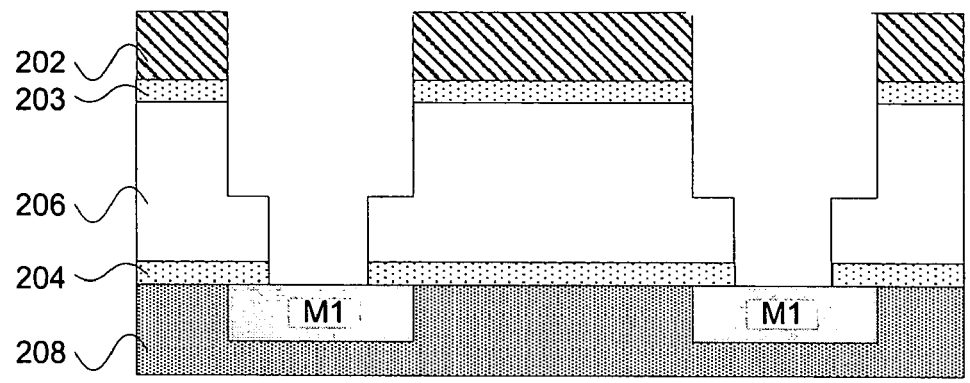
FIG. 2I shows the cross-sectional view of the layer stack of FIG. 2H in which a barrier layer is etched.
Figure 2J:
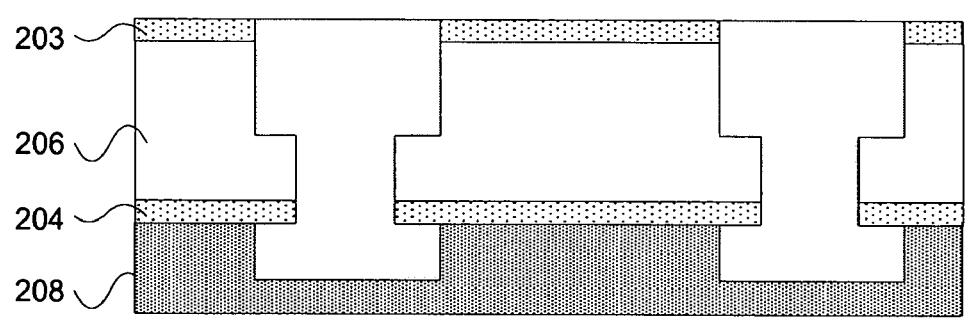
FIG. 2J shows the cross-sectional view of the layer stack of FIG. 2H in which a chemical mechanical polish process has been performed to polish the layer stack down to a cap layer.
Figure 3A:
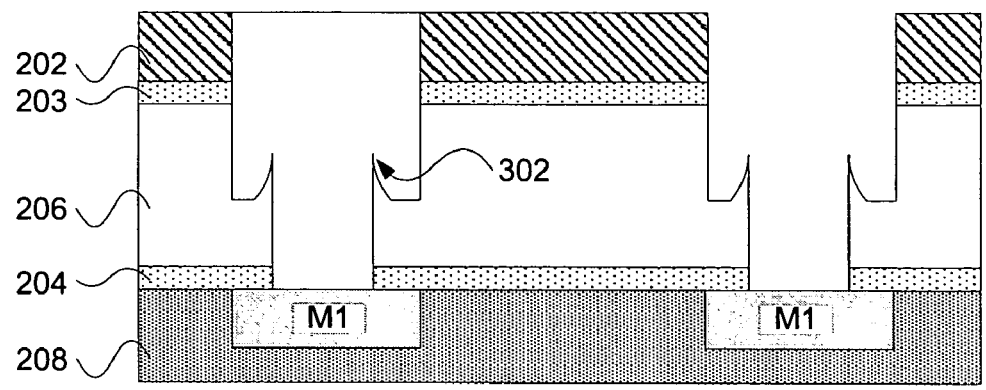
FIG. 3A shows the a cross-sectional view of a layer stack in which fencing has occurred.
Figure 3B:
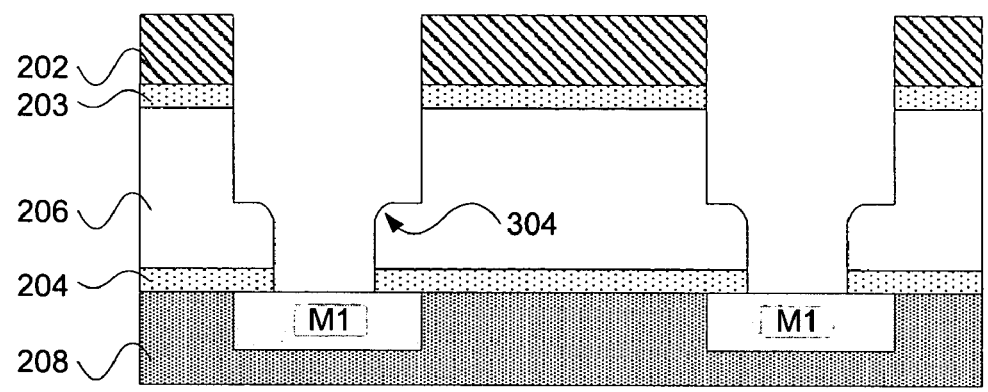
FIG. 3B shows the a cross-sectional view of a layer stack in which corner erosion has occurred.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously stated, the process of removing photoresist and BARC (bottom anti-reflective coating) can often damage low-k material in the substrate. For example, in general, dual damascene substrate manufacturing approaches require photoresist to be applied over a hard mask in order to lithographically pattern the underlying substrate, and also exposing the low-k material to oxygen.

While not wishing to be bound by theory, it is believed by the inventor herein that laying down a set of hard masks above the low-k material, will allow a via or trench to be etched without exposing the low-k material to oxygen used in conventional photoresist stripping processes. In addition, inspection of the set of hard masks may further minimize misalignment issues present with trench-first and dual hard mask dual-damascene methodologies.

In one embodiment, the masks are substantially comprised of metal materials. In another embodiment, a set of three masks and cap layer (or total four masks) is used. In another embodiment, the set of masks is comprised of different alternating mask materials. In another embodiment, the set of multiple masks may be used with dual damascene approaches to substrate manufacturing.

In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

In the current invention, in a non-obvious fashion, a substrate is configured with a mask or cap layer (e.g., TEOS, etc.) deposited between a set of hard masks and the low-k dielectric material. The cap layer and the set of hard masks are further comprised of a set of different alternating barrier materials, wherein a set of etchants may be selected whereby each individual etchant may possess a low selectivity to a particular type of barrier material, but a high selectivity to the remaining materials.

For example, etchants such as $C_4F_6$ and $C_4F_8$ have a low selectivity to (and hence will tend to etch) TEOS, but a high selectivity to (and hence will tend not to etch) SiN or SiC. Likewise, etchants such as $CF_4$, $CHF_3$, $CH_3F$, and $CH_2F_2$ have a low selectivity to SiN or SiC, but have a high selectivity to TEOS. The set of hard masks may then be patterned using traditional photoresist methods to create a hole for the via or trench. An anisotropic etch profile in the dielectric may then be achieved by using the appropriate set of etchants, such as based on fluorine chemistry as previously described.

To facilitate discussion, FIGS. 4A–F illustrate an idealized cross-sectional view of a layer stack, representing the layers of an exemplar semiconductor IC, in which a set of hard masks is employed to create a hole for a via or trench, as used in a dual-damascene manufacturing method, according to one embodiment of the current invention.

Figure 4A:
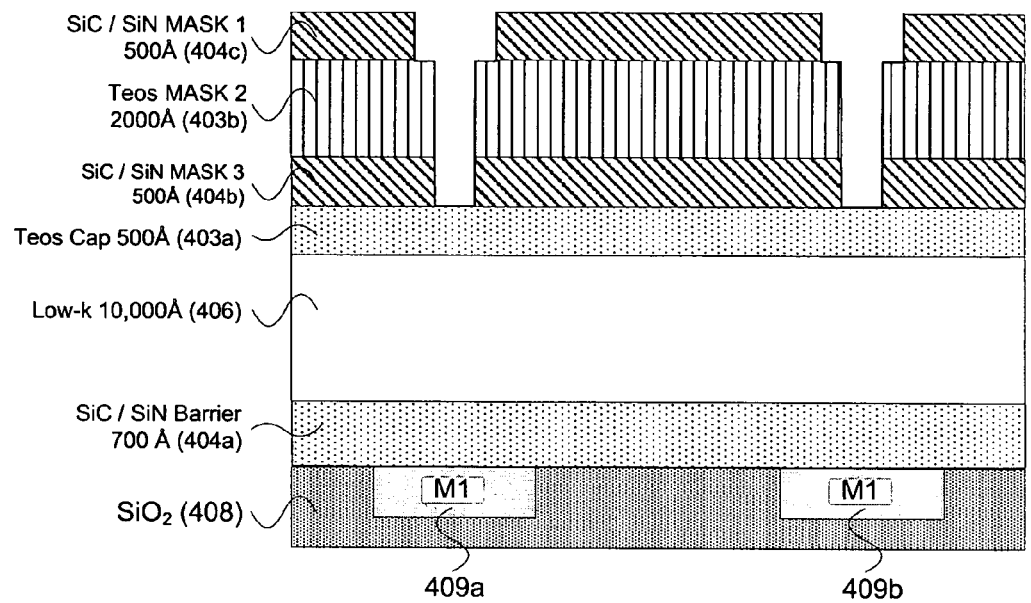
FIG. 4A a layer stack in which a set of three hard masks, comprised of two different barrier materials, has been deposited and patterned on the cap layer, according to one embodiment of the current invention.

FIG. 4A shows a layer stack in which a set of three hard masks, comprised of two different barrier materials, has been deposited and patterned on the cap layer, according to one embodiment of the current invention. At the bottom of layer stack, there is shown a layer 408, comprising $SiO_2$. Above layer 408 is disposed a barrier layer 404a, typically comprising nitride or carbide (e.g., SiN, SiC, etc.), and possessing a thickness of about 700 Å. Dual damascene substrates further comprise a set of metal layers including M1 409a–b, typically comprising aluminum or copper. Above the barrier layer 404a, is disposed a intermediate dielectric (IMD) layer 406, comprising a low-k material (e.g., SiOC, etc.), and possessing a thickness of about 10,000 Å. Above the IMD layer 406, there may be placed a cap layer 403a, typically comprising TEOS, and possessing a thickness of about 500 Å. Above cap layer 403, there may be disposed the set of hard masks that have been patterned using an appropriate method. Mask 3 404b comprises SiC or SiN, and has a thickness of about 500 Å. Mask 2 403b, comprises TEOS, and has a thickness of about 2000 Å. Mask 1 404c, comprises Sic or SiN, and has a thickness of about 500 Å.

Figure 4B:
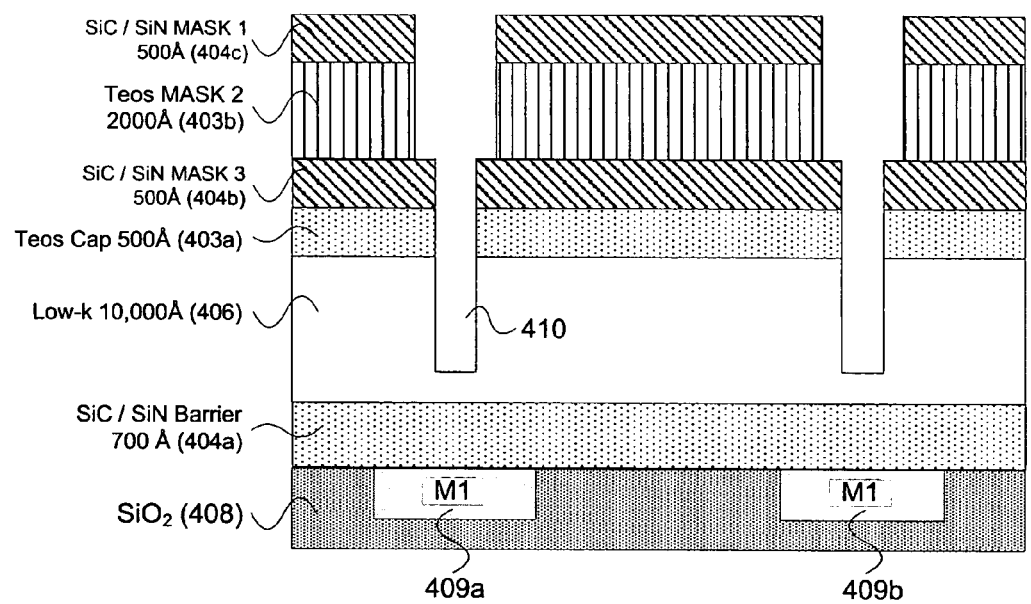
FIG. 4B shows the layer stack of FIG. 4A, in which a via has been etched using an appropriate etchant, according to one embodiment of the current invention.

FIG. 4B shows the layer stack of FIG. 4A, in which via 410 has been etched using an appropriate etchant, such as $C_4F_6$ and $C_4F_8$, which has a low selectivity to the TEOS material, comprising mask 2 403b and the cap layer 403a, but a high selectivity to SiN or SiC, comprising mask 1 404c and mask 3 404b. The initial profile of via 410 may thereby be defined by pattern of mask 3 404b.

Figure 4C:
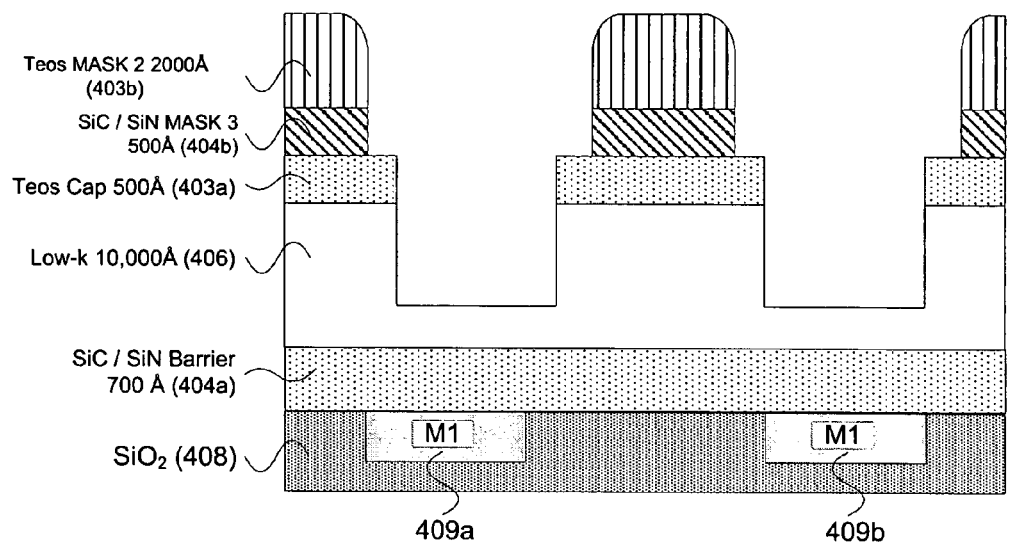
FIG. 4C shows the layer stack of FIG. 4B, in which mask 1 is removed using an appropriate etchant, according to one embodiment of the current invention.

FIG. 4C shows the layer stack of FIG. 4B, in which mask 1 404c, comprising SiN or SiC, is removed using an appropriate etchant, such as $CF_4$ and $CHF_3$, which has a low selectivity to SiN or SiC, but has a high selectivity to TEOS. In addition, the removal process also transfers a trench pattern onto mask 3 404b. Since the thickness of low-k material 406 (10,000 Å) is considerably greater than that of mask 1 404c (500 Å), only a small amount of the low-k material is removed due to the ion bombardment of the etchant.

Figure 4D:
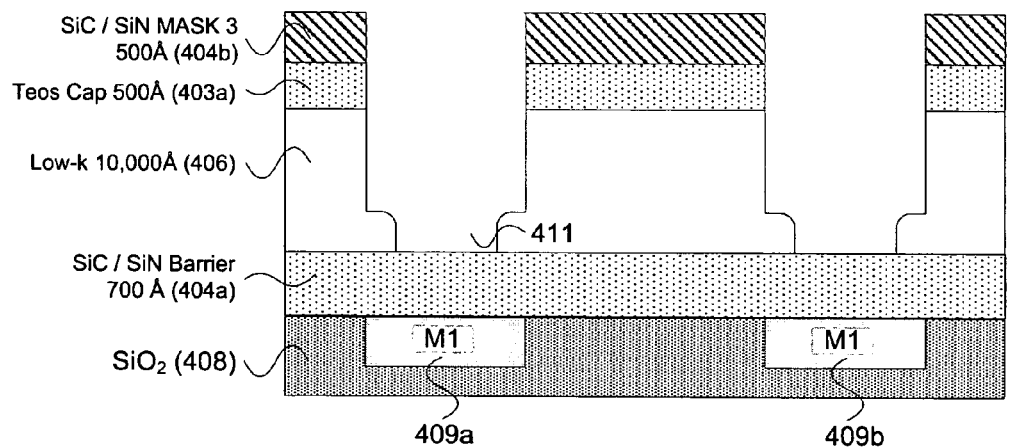
FIG. 4D shows the layer stack of FIG. 4C, in which mask 2 is removed using an appropriate etchant, according to one embodiment of the current invention.

FIG. 4D shows the layer stack of FIG. 4C, in which mask 2 403b, comprising TEOS, is removed using an appropriate etchant, such as $C_4F_6$ and $C_4F_8$, which has a low selectivity to the TEOS material comprising mask 2 403b and cap layer 403a, but a high selectivity to SiN or SiC comprising mask 3 404b and barrier 404a. The full dual damascene structure, such as trench 410 and via 411, in low-k material 406 may also be created, stopping at barrier 404a, due to the ion bombardment of the etchant.

Figure 4E:
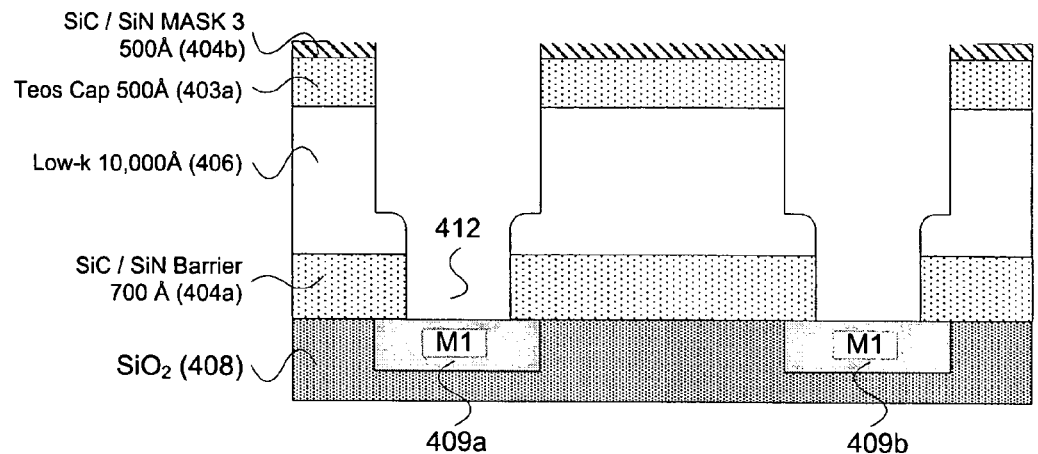
FIG. 4E shows the layer stack of FIG. 4D, in which a barrier has been etched using an appropriate etchant, according to one embodiment of the current invention.

FIG. 4E shows the layer stack of FIG. 4D, in which barrier 404a has been etched using an appropriate etchant, such as $CF_4$ and $CHF_3$, which has a low selectivity to SiN or SiC, but has a high selectivity to TEOS. In addition, most of mask 3, comprising SiN or SiC, has also been removed.

Figure 4F:
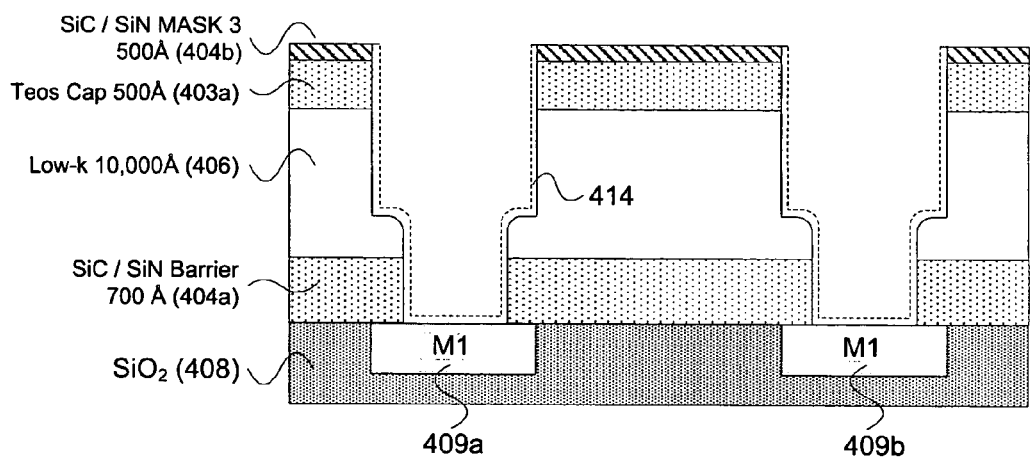
FIG. 4F shows the layer stack of FIG. 4E, in which a barrier has been added to the trench or via using an appropriate process, according to one embodiment of the current invention.

FIG. 4F shows the layer stack of FIG. 4E, in which a TaN or TiN barrier 414 has been added to the trench or via using an appropriate process, such as plasma vapor deposition.

Figure 4G:
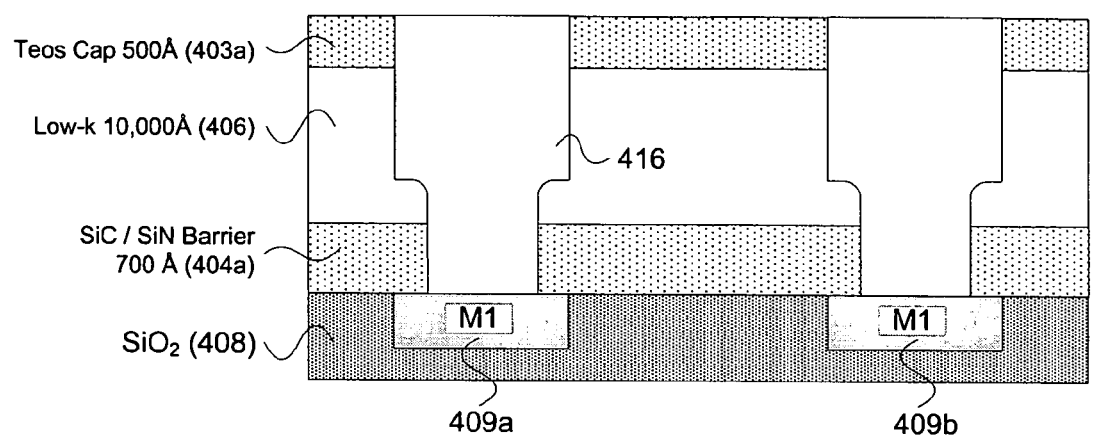
FIG. 4G shows the layer stack of FIG. 4E, in which the trench or via has been filled and the top layer stack has been polished using an appropriate process, according to one embodiment of the current invention.

FIG. 4G shows the layer stack of FIG. 4E, in which the trench or via has been filled with copper, or another appropriate conductive material, and the top layer stack has been polished using an appropriate process, such as chemical mechanical polishing.

Referring now to FIG. 5A, a simplified process in a plasma processing system is described in which a substrate is etched with a set of hard masks, according to one embodiment of the invention. Initially, a substrate is introduced in a plasma processing system, the substrate having a semi-conductor layer, a first barrier layer disposed above the semi-conductor layer, a low-k layer disposed above the first barrier layer, a third hard mask layer disposed above the low-k layer; a second hard mask layer disposed above the third hard mask layer, and a first hard mask layer disposed above the second hard mask layer, at step 502. The substrate is then alternatively etched with a first etchant and a second etchant, wherein the first etchant has a low selectivity to a first hard mask material of the first hard mask layer, a third hard mask material of the a third hard mask layer, and a first barrier layer material of the first barrier layer, but a high selectivity to a second hard mask material of the second hard mask layer, and wherein the second etchant has a high selectivity to the first hard mask material of the first hard mask layer, the third hard mask material of the third hard mask layer, and the first barrier layer material of the first barrier layer, and the second etchant has a low selectivity to the second hard mask material of the second hard mask layer, at step 504.

Referring now to FIG. 5B, a simplified process in a plasma processing system is described in which a substrate is etched with a set of hard masks, according to one embodiment of the invention. Initially, a substrate is introduced in a plasma processing system, the substrate having a semi-conductor layer, a first barrier layer disposed above the semi-conductor layer, a low-k layer disposed above the first barrier layer, a second barrier layer disposed above the low-k layer, a third hard mask layer disposed above the second barrier layer, a second hard mask layer disposed above the third hard mask layer, and a first hard mask layer disposed above the second hard mask layer, at step 506. The substrate is then alternatively etched with a first etchant and a second etchant, wherein the first etchant has a low selectivity to a first hard mask material of the first hard mask layer, a third hard mask material of the a third hard mask layer, and a first barrier layer material of the first barrier layer, but a high selectivity to a second hard mask material of the second hard mask layer, and wherein the second etchant has a high selectivity to the first hard mask material of the first hard mask layer, the third hard mask material of the third hard mask layer, and the first barrier layer material of the first barrier layer, and the second etchant has a low selectivity to the second hard mask material of the second hard mask layer and the second barrier layer, at step 508.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). Also, photoresist plasma etchants comprising gases other than oxygen may be used. It should also be noted that there are many alternative ways of implementing the methods of the present invention.

Advantages of the invention include the optimization of substrate etching in a plasma processing system. Additional advantages may include the minimization of photoresist damage due to exposure to oxygen-based etchants, minimization of RC delay on the substrate, elimination of a plug step during a dual damascene manufacturing process, minimization of trench and via faceting and fencing during the etch process, and minimization of trench and via misalignment during the etch process.

Having disclosed exemplary embodiments and the best mode, modifications and variations may be made to the disclosed embodiments while remaining within the subject and spirit of the invention as defined by the following claims.

What is claimed is:

1. In a plasma processing system, a method etching a substrate, said substrate having a semi-conductor layer, a first barrier layer disposed above said semi-conductor layer, a low-k layer disposed above said first barrier layer, a third hard mask layer disposed above said low-k layer; a second hard mask layer disposed above said third hard mask layer, and a first hard mask layer disposed above said second hard mask layer, comprising:
    alternatively etching said substrate with a first etchant and a second etchant, wherein said first etchant has a low selectivity to a first hard mask material of said first hard mask layer, a third hard mask material of said a third hard mask layer, and a first barrier layer material of said first barrier layer, but a high selectivity to a second hard mask material of said second hard mask layer,
    wherein said second etchant has a high selectivity to said first hard mask material of said first hard mask layer, said third hard mask material of said third hard mask layer, and said first barrier layer material of said first barrier layer, and said second etchant has a low selectivity to said second hard mask material of said second hard mask layer, and
    wherein said alternatively etching includes etchin artiall tbrou h said low-k layer and said first barrier layer with said second etchant.

2. The method of claim 1 wherein said alternatively etching includes substantially removing said first hard mask material.

3. The method of claim 1, wherein said first hard mask material, said second hard mask material, and said third hard mask material are lithographically patterned for a dual-damascene manufacturing method.

4. The method of claim 1, wherein said first hard mask material is SiN.

5. The method of claim 1, wherein said first hard mask material is SiC.

6. The method of claim 1, wherein said second hard mask material is TEOS.

7. The method of claim 1, wherein said third hard mask material is SiN.

8. The method of claim 1, wherein said third hard mask material is SiC.

9. The method of claim 1, wherein said first barrier layer is SiN.

10. The method of claim 1, wherein said first barrier layer is SiC.

11. The method of claim 1, wherein first etchant is $CF_4$.

12. The method of claim 1, wherein first etchant is $CHF_3$.

13. The method of claim 1, wherein second etchant is $C_4F_6$.

14. The method of claim 1, wherein second etchant is $C_4F_8$.

15. The method of claim 1, further including a second barrier layer, comprised of a second barrier material, is disposed between said third hard mask layer and said low-k layer, whereas said second etchant has a low selectivity to said second barrier material, and said first etchant has a high selectivity to said second barrier material.

16. The method of claim 15, wherein said alternatively etching includes etching partially through said second barrier layer with said second etchant.

17. The method of claim 16, wherein said second etchant etches at least a portion of said second hard mask layer, said low-k layer, and said second barrier layer substantially simultaneously.

18. The method of claim 15, wherein said second barrier layer is TEOS.

19. In a plasma processing system, a method etching a substrate, said substrate having a semi-conductor layer, a first barrier layer disposed above the semi-conductor layer, a low-k layer disposed above the first barrier layer, a second barrier layer disposed above the low-k layer, a third hard mask layer disposed above the second barrier layer, a second hard mask layer disposed above the third hard mask layer, and a first hard mask layer disposed above the second hard mask layer, comprising:
    alternatively etching said substrate with a first etchant and a second etchant, wherein said first etchant has a low selectivity to a first hard mask material of said first hard mask layer, a third hard mask material of said a third hard mask layer, and a first barrier layer material of said first barrier layer, but a high selectivity to a second bard mask material of said second hard mask layer,
    wherein said second etchant has a high selectivity to said first hard mask material of said first hard mask layer, said third hard mask material of said third hard mask layer, and said first barrier layer material of said first barrier layer, and said second etchant has a low selectivity to said second hard mask material of said second hard mask layer and said second barrier layer, and
    wherein said alternatively etchinc includes etching partially through said low-k layer and said first barrier layer with said second etchant.

20. The method of claim 19 wherein said alternatively etching includes substantially removing said first hard mask material.

21. The method of claim 19, wherein said alternatively etching includes etching partially through said second barrier layer with said second etchant.

22. The method of claim 19, wherein said second etchant etches at least a portion of said second hard mask layer, said low-k layer, and said second barrier layer substantially simultaneously.

23. The method of claim 19, wherein said first hard mask material, said second hard mask material, and said third hard mask material are lithographically patterned for a dual-damascene manufacturing method.

24. The method of claim 19, wherein said first hard mask material is SiN.

25. The method of claim 19, wherein said first hard mask material is SiC.

26. The method of claim 19, wherein said second hard mask material is TEOS.

27. The method of claim 19, wherein said third hard mask material is SiN.

28. The method of claim 19, wherein said third hard mask material is SiC.

29. The method of claim 19, wherein said first barrier layer is SiN.

30. The method of claim 19, wherein said first barrier layer is SiC.

31. The method of claim 19, wherein said second barrier layer is TEOS.

32. The method of claim 19, wherein first etchant is $CF_4$.

33. The method of claim 19, wherein first etchant is $CHF_3$.

34. The method of claim 19, wherein second etchant is $C_4F_6$.

35. The method of claim 19, wherein second etchant is $C_4F_8$.

* * * * *